(12) United States Patent
Lukens et al.

(10) Patent No.: US 7,019,526 B2
(45) Date of Patent: Mar. 28, 2006

(54) SAMPLE CATCHER FOR NMR APPARATUS AND METHOD UTILIZING THEREOF

(75) Inventors: Peter C. Lukens, Mountain View, CA (US); Dusan Baic, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/852,033

(22) Filed: May 24, 2004

(65) Prior Publication Data

US 2005/0258834 A1    Nov. 24, 2005

(51) Int. Cl.
*G01V 3/00* (2006.01)

(52) U.S. Cl. .................................. 324/321; 324/300

(58) Field of Classification Search ............... 324/321, 324/300
See application file for complete search history.

(56) References Cited

U.S. PATENT DOCUMENTS

| | | | |
|---|---|---|---|
| 4,581,583 A * | 4/1986 | Van Vliet et al. ........... 324/321 |
| 4,827,761 A | 5/1989 | Vinegar et al. |
| 4,859,948 A * | 8/1989 | Kuster ......................... 324/318 |
| 5,100,202 A * | 3/1992 | Hughes .................. 297/378.11 |
| 5,146,166 A | 9/1992 | Bartuska et al. |
| 5,162,103 A | 11/1992 | Dechene et al. |
| 5,200,702 A * | 4/1993 | Lilly et al. ................... 324/321 |
| 5,534,780 A * | 7/1996 | Lilly ........................... 324/321 |
| 5,952,831 A * | 9/1999 | Yamakoshi et al. .......... 324/321 |
| 6,499,366 B1 * | 12/2002 | Meadows et al. ......... 73/864.81 |
| 6,902,703 B1 * | 6/2005 | Marquiss et al. ........... 422/100 |

* cited by examiner

*Primary Examiner*—Michael Tokar
*Assistant Examiner*—Jeremiah Shipman
(74) *Attorney, Agent, or Firm*—Bella Fishman

(57) ABSTRACT

An NMR apparatus, sample contained in a sample holder is ejected from an NMR probe to the top of the magnet region where a sample latching mechanism holds the sample in place without requiring a continuing flow of pressurized gas, electrical power or other outside force. The sample can then be removed and/or exchanged with another sample that is also held in place without the expenditure of gas. When ready the operator depresses a lever arm enabling the exchanged sample to move into the probe.

15 Claims, 3 Drawing Sheets

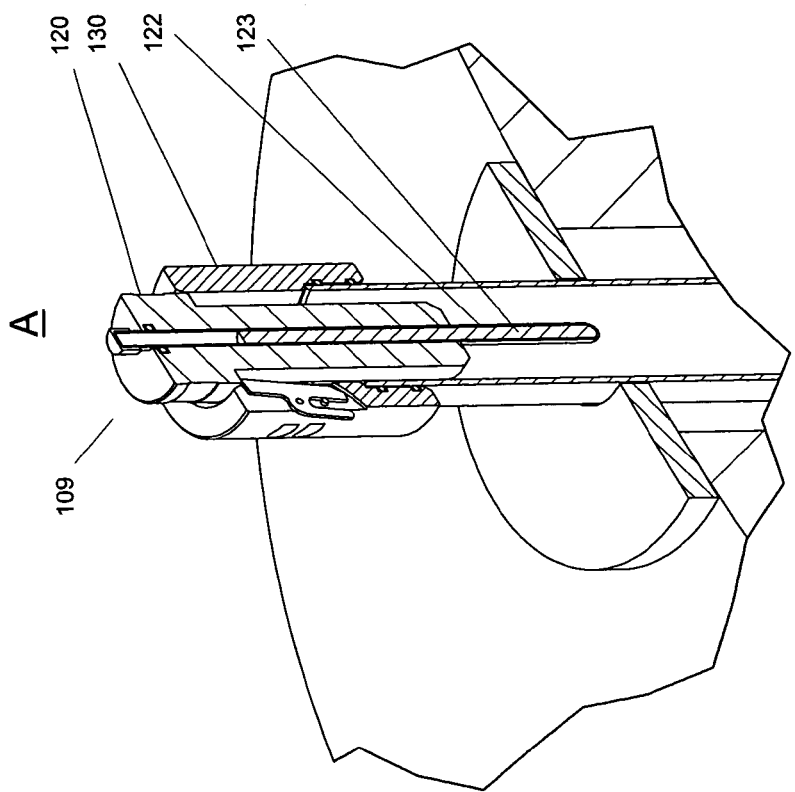
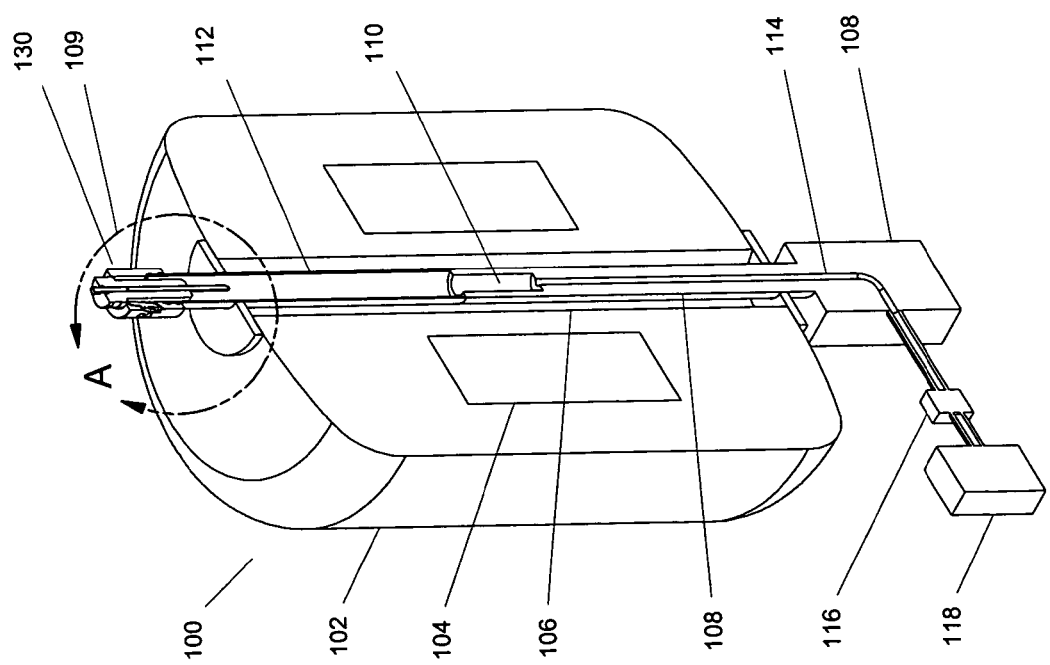
Fig. 2
Fig. 1

SAMPLE CATCHER FOR NMR APPARATUS AND METHOD UTILIZING THEREOF

FIELD OF THE INVENTION

This invention in general relates to the field of nuclear magnetic resonance (NMR) and in particular changing the NMR sample in NMR apparatus.

BACKGROUND OF THE INVENTION

NMR spectrometers for the generation of spectral data typically employ superconducting solenoid magnets to produce a strong vertically oriented static magnetic field $B_0$. The solenoid coils are mounted in a Dewar that provides a low temperature environment required for superconductivity. The Dewar includes a reentrant central tube section that permits the probe to be at a different temperature, usually at room temperature. During the operation of obtaining data, the NMR sample is situated within a probe that contains one or more radio frequency (RF) coils for generating RF magnetic fields that are perpendicular to the static field, $B_0$. The sample is mounted in a sample holder that often also serves as a spinner to rapidly rotate the sample during the time data is being recorded. The probe is connected electrically to the spectrometer console that contains the electronics for generating the RF signals and detecting and recording the NMR response of the nuclei being studied. Provision may also be provided for spinning the sample. This is normally achieved by making the sample holder also serve as a rotor of a gas driven turbine.

When sufficient data has been obtained, the sample holder and sample are ejected from the probe to the top of the Dewar for easy sample exchange. Typically this is achieved by a flow of compressed gas that lifts the sample holder and sample through a cylindrical pipe to the exchange region at the top of the Dewar where it can be easily removed and if desired exchanged with the next sample to be analyzed. The gas flow must be maintained until the operator removes the sample and possibly replaces it by the next sample to be analyzed. When inserting the next sample, the gas flow must be maintained until it is ready to be inserted into the probe. If the gas flow should fail during any of these steps, the sample and sample holder would drop prematurely and in an uncontrolled fashion into the magnet.

SUMMARY OF THE DISCLOSURE

It is a main advantage of the present invention, which allows to protect the sample with a sample catcher from entering the magnet bore of NMR apparatus in the event of loss of compressed gas. In a nuclear magnetic resonance apparatus, which comprises a magnet producing a magnetic field for applying to the nuclear magnetic resonance sample, a probe positioned within the magnet and a sample holed for holding and loading the sample to the probe, the sample catcher is mounted on the top of the magnet at a sample exchange region. The sample holder with the sample is pushed from the probe to the sample exchange region via a sample passageway by a compressed gas flow and being latched by the sample catcher latch mechanism. The sample catcher has a cylindrical chamber with a slot extending through the wall thereof. A latch mechanism, which is mounted within the slot, consists of an arm fixed on a mechanical pivot, and a limit pin for limiting the rotation of the arm from latched to cleared position within the slot. The mechanical pivot passes through the arm at the location where the distance from the cylindrical chamber is greater than the center of gravity of the arm. The arm is moved towards the sample holder in a latch position under a force of gravity traversing the slot into the sample passageway when the sample holder is ejected into the exchange region. In the latch position an upper end of the arm is rested either on a cylindrical shoulder or a flat bottom of the sample holder.

The sample catcher latches the sample holder without requiring a continuing supply of compressed gas. In addition the sample catcher holds a newly inserted sample until the operator is ready for it to be inserted into the probe.

BRIEF DESCRIPTION OF THE DRAWINGS

The invention, its advantages and its mode of operation are best understood by reference to the accompanying drawings wherein:

FIG. 1 depicts a magnet including a probe, and the sample catcher.

FIG. 2 is a more detailed sketch of the sample catcher with a sample and sample holder positioned within it.

Figure 4:
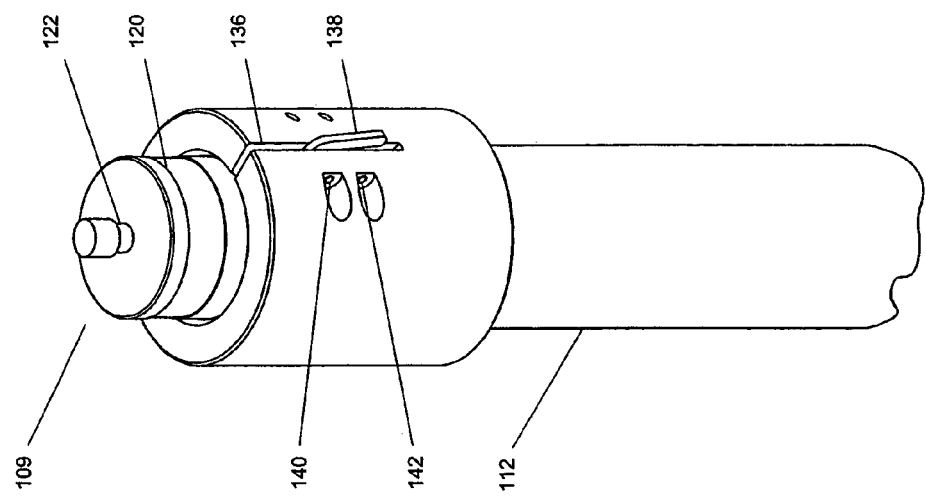
FIG. 4 is a perspective view of the sample catcher.

In the drawings the elements of the claimed invention are designated with the following labellings.

100 Magnet
102 Dewar
104 Solenoid coils
106 Central Dewar tube
108 Probe
109 Exchange region
110 Upper region of probe 108
112 Sample passageway
114 Gas tube
116 Gas valve
118 Gas source
120 Sample holder
122 Sample tube
123 Sample
124 Cylindrical shoulder of sample holder 120
128 O-rings
130 Sample catcher
132 Latch mechanism
134 Cylinder
136 Slot
138 Arm
140 Mechanical pivot
142 Limit pin
220 Sample holder
230 Sample catcher
234 Cylinder

DETAILED DESCRIPTION OF THE DISCLOSURE

Typical high performance NMR spectrometers use superconducting magnets to provide a constant magnetic field typically in the range of 7 T to 25 T corresponding to proton frequencies of 300 MHz to 1000 MHz. The magnet comprises one or more superconducting solenoid coils mounted in a Dewar. The axes of the coils are vertical thereby producing a strong vertical magnetic field. A coolant such as liquid helium surrounds the coils to maintain a low temperature as required to maintain a superconducting state. A central tube of the Dewar passes through the coils and extends from the bottom to the top of the Dewar providing room-temperature access to the high magnetic field strength at the center of the solenoid coils.

The major elements of a NMR system incorporating the present invention are illustrated in FIG. 1. Magnet, 100, comprises Dewar, 102, containing solenoid coils, 104, with central Dewar tube, 106, passing through the coils and extending from bottom to the top of the dewar. The NMR probe, 108, extends into central Dewar tube 106 from the bottom, and is electrically coupled to the NMR spectrometer, not shown. When taking data the sample holder with the sample fits into the upper region 110 of the probe 108. To eject the sample holder and sample, compressed gas is fed into gas tube 114 from gas source 118. Typically gas source 118 comprises a compressed gas cylinder with a pressure regulator. Electrically activated gas valve 116 is used to switch the gas flow on. When valve 116 is activated gas flows through gas tube 114, which transports the gas through probe 108 and into the lower end of sample passageway 112. The compressed gas pushes any sample holder and sample that may be in the probe up passageway 112 to sample catcher 130 located in the exchange region 109 at the top of magnet 100. Sample catcher 130 latches and maintains the sample holder at the top of the magnet where it is easily removed or exchanged by the operator. The compressed gas need no longer remain flowing once the sample is held in place by sample catcher 130, and by means of gas valve 116 the gas flow may be terminated to conserve gas.

FIG. 2 is a more detailed sketch of exchange region 109. The sample 123 is contained in sample tube 122, which is supported by sample holder 120. Sample catcher 130 is fixed to the upper end of sample passageway 112. Sample holder 120 is latched in place and sample catcher 130 maintains sample holder 120 in the exchange region 109 at the top of magnet after the compressed gas flow is interrupted.

Figure 3:
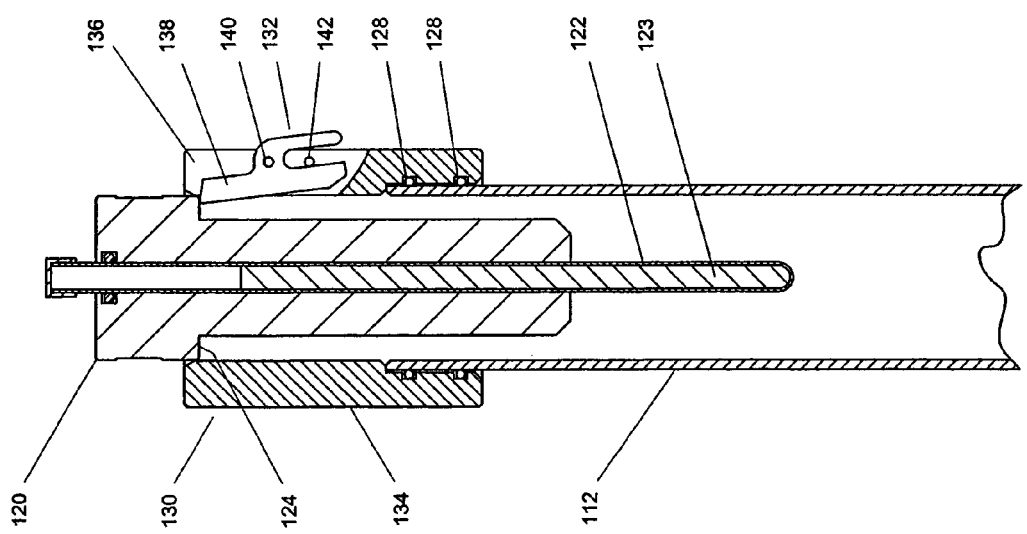
FIG. 3 is a crossectional view of the sample catcher mechanism and its relationship to the sample holder and the sample.

FIG. 3 is a crossectional view of the preferred embodiment of sample catcher 130 with detail of the latch mechanism 132. Sample catcher 130 consists of cylinder 134 that is fixed to the top of sample passageway 112. Two O-rings, 128, on the interior of cylinder 134 make a gas-tight seal with sample passageway 112. A slot, 136, in the wall of cylinder 134 contains arm 138 that forms part of the latch mechanism 132. Cylinder 134 includes a mechanical pivot 140 and a limit pin 142 that traverse slot 136. Arm 138 is held in place by mechanical pivot 140, but is free to rotate about it. Arm 138 is shaped and weighted causing it to rotate into a position where its upper edge protrudes slightly into the inside surface of cylinder 134. This upper edge provides a ledge for cylindrical shoulder 124 of sample holder 120 to rest on. Typically cylinder 134 and arm 138 are made of different non-magnetic metals, such as aluminum and bronze respectively.

When the sample holder 120 is ejected from probe 108 (FIG. 1) by compressed gas, the sample holder 120 rises up through sample passageway 112 past the arm 138 that rotates out of the way. After the sample holder shoulder 124 has cleared the arm, the arm's weight causes it to rotate back to the rest position where it protrudes again into the inside surface of cylinder 134. Once sample holder 120 has risen past arm 138 and the arm has rotated back to its rest position, the sample holder cannot drop back down past the upper edge of arm 138 until the arm is physically moved out of the way by the system operator. The operator does this by depressing the portion of the arm below mechanical pivot 140, causing the arm to rotate about the pivot thereby retracting arm 138 out of the passageway of cylinder 134 thereby releasing sample holder 120. A limit pin, 142, limits the rotational range of metal arm 138 so that in the absence of the sample holder, the arm will not penetrate cylinder 134 any deeper than required to support the sample holder and thereby prevent proper operation.

FIG. 4 is a perspective view of sample catcher of FIG. 3. The section of arm 138 protruding out of gap 136 provides a means for the operator to depress and rotate arm 138 thereby releasing sample holder 120, permitting it to return to the probe under the power of gravity.

Figure 5:
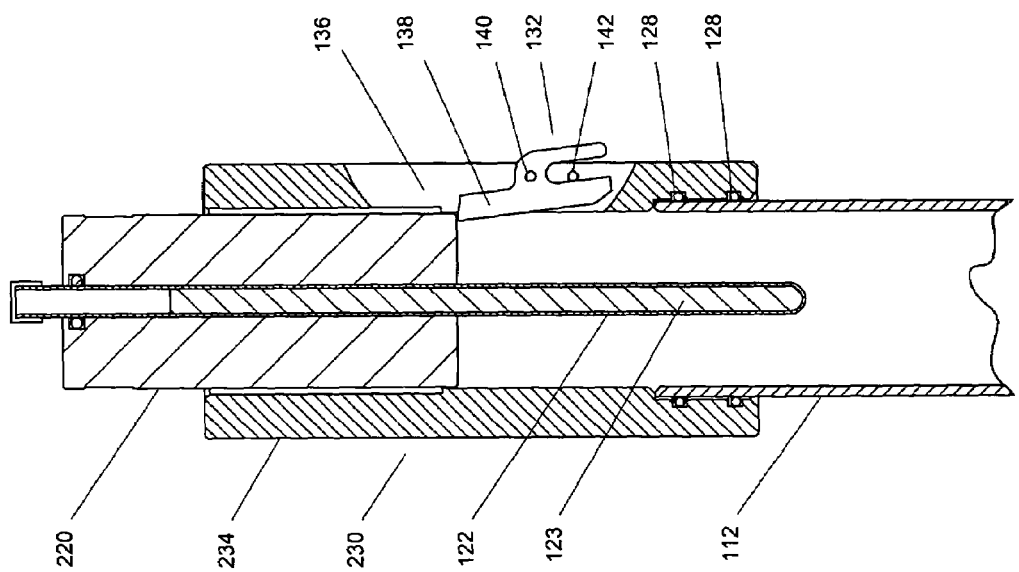
FIG. 5 is a crossectional view of an alternative sample catcher embodiment.

FIG. 5 is an alternative embodiment wherein the sample holder, 220, has a flat bottom without a shoulder. Sample catcher 230 has a lower section configured as described in conjunction with FIG. 3, however cylinder 234 has a section that extends above the arm 138 thereby providing a region to contain sample holder 220. The inside wall of this upper region of cylinder 234 has a larger inside diameter thereby permitting the compressed gas to escape after the sample holder 220 has been pushed up the passageway 112 to a region beyond the top of arm 138.

While a specific embodiment of the invention has been described in detail, it will be clear that variations in details of the embodiment specifically illustrated and described may be made by those skilled in the art without departing from the true spirit and scope of the invention. For example various metals and plastics may be used for parts of the sample catcher. Variations may be made in the details of the catcher mechanism.

What is claimed is:

1. A nuclear magnetic resonance apparatus comprising:
    a magnet which produces a magnetic field for applying to a nuclear resonance sample;
    a nuclear magnetic resonance probe positioned within a bore of said magnet,
    a sample passageway extended via said probe, said passageway comprising a sample exchange region;
    a sample holder, which holds and loads the sample into said probe; and
    a sample catcher mounted onto the sample passageway within the exchange region latching said sample holder being ejected from said probe for sample removal or reloading, said sample catcher comprising:
        a first cylindrical body having a cylindrical bore therein and a slot extending through a wall thereof, and
        a latch mechanism disposed within said slot and comprising an arm, a mechanical pivot turning said arm within said slot, and a limit pin, which limits a rotational range of said arm, said arm is moved towards said sample holder under a force of gravity traversing said slot into the sample passageway when the sample holder is ejected to the sample exchange region.

2. The apparatus of claim 1, further comprising a gas source, which provides a compressed gas flow within said sample passageway for moving said sample holder therein.

3. The apparatus of claim 1, wherein said sample holder comprises a second cylindrical body that is movable within said cylindrical bore of said first cylindrical body.

4. The apparatus of claim 3, wherein said first cylindrical body comprises at least one O-ring disposed on the interior thereof which provides a gas tight seal with said sample passageway.

5. The apparatus of claim 1, wherein said first cylindrical body and said arm are made from a non-magnetic material.

6. The apparatus of claim 5, wherein said second cylindrical body of said sample holder further comprises a cylindrical shoulder for resting thereon an upper edge of said arm of said sample catcher in a latch position.

7. The apparatus of claim 5, wherein said first cylindrical body of said sample catcher having a bottom and an upper portions, the diameter of said bottom portion is smaller than the diameter of said upper portion for releasing the compressed gas flow when said sample holder is moved to the exchange region, and said second cylindrical body of said sample holder having a flat bottom portion for resting thereon an upper edge of said arm of said sample catcher in a latch position.

8. The apparatus of claim 1, wherein said first cylindrical body and said arm are made from different materials.

9. The apparatus of claim 8, wherein said first cylindrical body is made from aluminum.

10. A sample catcher of a nuclear magnetic resonance apparatus for retaining a sample holder in a sample exchange region comprising:
    a hollow cylindrical body forming a chamber for maintaining the sample holder therein in a vertical position;
    said chamber having a slot intersecting a wall of said chamber; and
    a latch mechanism disposed within said slot, which latches said sample holder within said chamber after a gas flow ejecting said sample holder into a sample exchange region is terminated, said latch mechanism comprising an arm, a mechanical pivot supporting said arm, and a limit pin constraining a rotation of said arm between a first and a second positions where the arm protruding into and clearing out of said chamber respectively.

11. The sample catcher of claim 10, wherein said mechanical pivot passes through said arm at the location where a distance from said pivot to said cylindrical chamber is greater than a distance from the center of gravity of said arm to said cylindrical chamber.

12. The sample catcher of claim 11, wherein said chamber and said arm are made from non-magnetic materials.

13. A method of retaining a sample holder within a sample catcher of a nuclear magnetic resonance apparatus comprising the steps of:
    providing the sample catcher having a cylindrical hollow body with a slot within a wall thereof and a latch mechanism, which is disposed within the slot and having a movable arm, mechanical pivot and a limit pin constraining the rotation of the arm between a first and a second positions where the arm protruding into and being cleared of the cylindrical hollow body respectively;
    mounting the sample catcher at a top portion of a sample passageway within an exchange region;
    moving the sample holder by a compression gas flow into the exchange region;
    pushing the latch mechanism out of the slot by a body of the sample holder;
    terminating the compression gas flow via the sample passageway; and
    latching the sample holder within the cylindrical chamber by resting the body of the sample holder on the latch mechanism.

14. The method of claim 13, wherein a distance from the mechanical pivot passing through the arm to the cylindrical chamber is greater than a distance from the center of gravity of the arm to the cylindrical chamber.

15. The method of claim 14, further comprising the step of forming a body of the sample holder with a shoulder or with a flat bottom, wherein in a latch position an upper edge of the arm is rested on the shoulder or on the flat bottom.

* * * * *